United States Patent [19]
Abe

[11] Patent Number: 6,028,368
[45] Date of Patent: Feb. 22, 2000

[54] SEMICONDUCTOR DEVICE WITH POTTING RESIN STRUCTURES

[75] Inventor: Masaaki Abe, Kumamoto, Japan

[73] Assignee: NEC Corporation, Tokyo, Japan

[21] Appl. No.: 09/022,275

[22] Filed: Feb. 11, 1998

[30] Foreign Application Priority Data

Feb. 13, 1997 [JP] Japan ................................ 9-028831

[51] Int. Cl.[7] .................................................. H01L 23/28
[52] U.S. Cl. ........................ 257/787; 257/667; 257/687; 438/123; 438/124
[58] Field of Search .................................... 257/666, 667, 257/669, 674, 678, 687, 690, 787, 778, 790, 793; 438/112, 108, 124, 125, 126, 127, 123

[56] References Cited

U.S. PATENT DOCUMENTS 5,757,066  5/1998  Inoue et al. .............................. 257/666

FOREIGN PATENT DOCUMENTS 5-47979  2/1993  Japan .

*Primary Examiner*—Tom Thomas
*Assistant Examiner*—Luan Thai
*Attorney, Agent, or Firm*—Young & Thompson

[57] ABSTRACT

A semiconductor apparatus that can limit the shifting of a semiconductor device when it is sealed with a sealing resin and can prevent bonding wires from being exposed at the surface of the sealing resin, and that can provide improved resistance to moisture and prevent deterioration of performance and reliability, potting resin structures are affixed to bonding wire mounting faces of a plurality of inner leads before they are sealed by a sealing resin, so that the tops of the potting resin structures are higher than the positions at which the bonding wires are mounted. With this arrangement, the shifting of the semiconductor device is halted by the potting resin structures, the bonding wires are not exposed at the surface of the sealing resin, and the potting resin structures and the sealing resin are closely attached, so that resistance to moisture is improved.

5 Claims, 3 Drawing Sheets

SEMICONDUCTOR DEVICE WITH POTTING RESIN STRUCTURES

BACKGROUND OF THE INVENTION

1. Field of the Invention

The present invention relates to a semiconductor apparatus, and in particular to a resin sealed semiconductor apparatus.

2. Related Arts

For a resin sealed semiconductor apparatus, a semiconductor device having a plurality of electrodes, such as bonding pads, is fixed at a predetermined position in a lead frame having a plurality of inner leads, the electrodes and the corresponding inner leads are connected together by bonding wires, and the inner leads, the semiconductor device and the bonding wires are sealed by using a sealing resin.

Such a conventional semiconductor apparatus is shown in FIGS. 1A and 1B.

As is shown in FIG. 1A, the semiconductor apparatus comprises: a lead frame having a plurality of inner leads 1; a pressure sensitive double coated adhesive tape 2 applied on the lower face of each inner lead 1 of the lead frame; a semiconductor device 3 bonded to the adhesive tape 2 and having a plurality of electrodes; a plurality of bonding wires 4 used to connect the electrodes of the semi-conductor device 3 to the corresponding inner leads 1; and a sealing resin 5 for sealing the semiconductor device 3, which is bonded to the inner leads 1 (the lead frame) by the adhesive tape 2, and the bonding wires 4.

In this semiconductor apparatus, to seal the inner leads 1 using the sealing resin 5, as is shown in FIG. 1B, the lead frame having the inner leads 1 is placed in a sealing jig 7 and the sealing resin 5 is introduced into the sealing jig 7 through a sealing gate 71. At this time, the quantity of the introduced sealing resin 5 tends to vary at the upper face and the lower face of the semiconductor device 3, consistent with the shapes and positions of the inner leads 1 and the semiconductor device 3 and the condition of the sealing resin 5 when it is introduced. Since in this case, particularly, more sealing resin 5 tends to be introduced at the lower face of the semiconductor device 3, it is shifted upward until the bonding wires 4 are exposed at the surface of the sealing resin 5.

To resolve this problem, Japanese Unexamined Patent Publication No. Hei 5-47979 proposes that a support lead is provided for the lead frame to prevent the shifting of the semiconductor device.

Another example of a semiconductor apparatus having a support lead is shown in FIG. 2.

In this semiconductor apparatus, a semiconductor 3 is mounted and fixed to an island 81 comprising a lead frame, and support leads 9a and 9b, coated with an insulating tape, are provided at predetermined positions (the island 81, etc.) in the lead frames so that the island 81 and the semiconductor device 3 will not be shifted when they are sealed by a sealing resin 5.

Since the constant distance between the island 81 and the internal wall of a sealing jig is maintained by the support leads 9a and 9b when the semiconductor device is sealed by the sealing resin 5, the island 81 is not shifted, and thus the bonding wires 4 are prevented from being exposed at the surface of the sealing resin 5.

In the first conventional semiconductor apparatus as above-mentioned, when the semiconductor device is sealed with the sealing resin 5, it is shifted upward and the bonding wires 4 are exposed at the surface to the sealing resin 5, resulting in deterioration of performance and reliability. In the second conventional semiconductor apparatus, although the island 81 and the semiconductor device 3 are prevented from shifting by the support leads 9a and 9b, since the support leads 9a and 9b are exposed at the surface of the sealing resin 5, moisture easily enters from the exterior along the support leads 9a and 9b, resulting in deterioration in resistance to moisture and also, as in the first example, degradation of performance and reliability.

SUMMARY OF THE INVENTION

It is, therefore an object of the present invention to provide a semiconductor apparatus that can restrict the shifting of a semiconductor device when it is sealed with a sealing resin and can thus prevent bonding wires from being exposed at the surface of the sealing resin, and that can improve resistance to moisture and prevent deterioration of performance and reliability.

To achieve the above object, according to the present invention, provided is a semiconductor apparatus wherein a semiconductor device is fixed at a predetermined position in a lead frame having a plurality of inner leads, a plurality of electrodes of the semiconductor device are connected to corresponding inner leads by bonding wires, and the inner leads, the semiconductor device and the bonding wires are sealed by a sealing resin; and wherein, before the inner leads, the semiconductor device and the bonding wires are sealed in the sealing jig by using the sealing resin, potting resin structures are affixed to a plurality of predetermined faces of the lead frame, on which the bonding wires are to be mounted and which are to be sealed by the sealing resin, so that the tops of the potting resin structures are higher than the positions of the bonding wires. In addition, an upper height limit and a mounting position for the potting resin structures are so defined that the sealing resin having a predetermined thickness is formed on an upper face and on a lower face of the semiconductor device.

DETAILED DESCRIPTION OF THE PREFERRED EMBODIMENT

The preferred embodiment of the present invention will now be described while referring to the accompanying drawings.

Figure 1A:
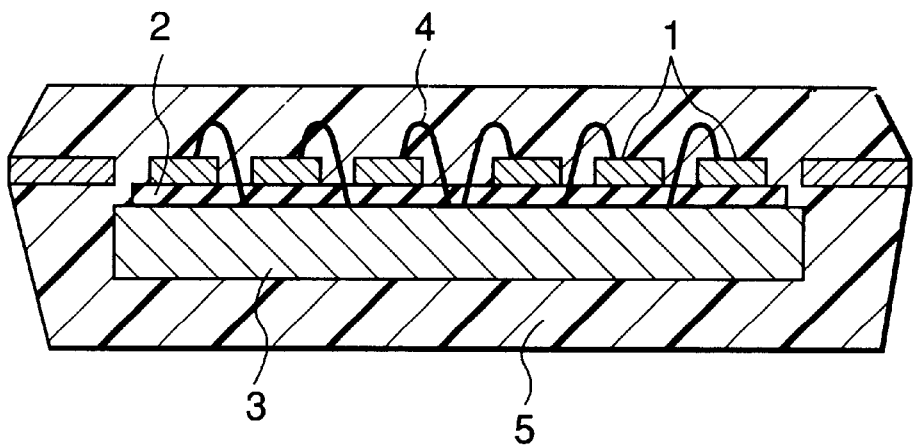
FIG. 1A is a cross-sectional view of a first conventional semiconductor apparatus.
Figure 1B:
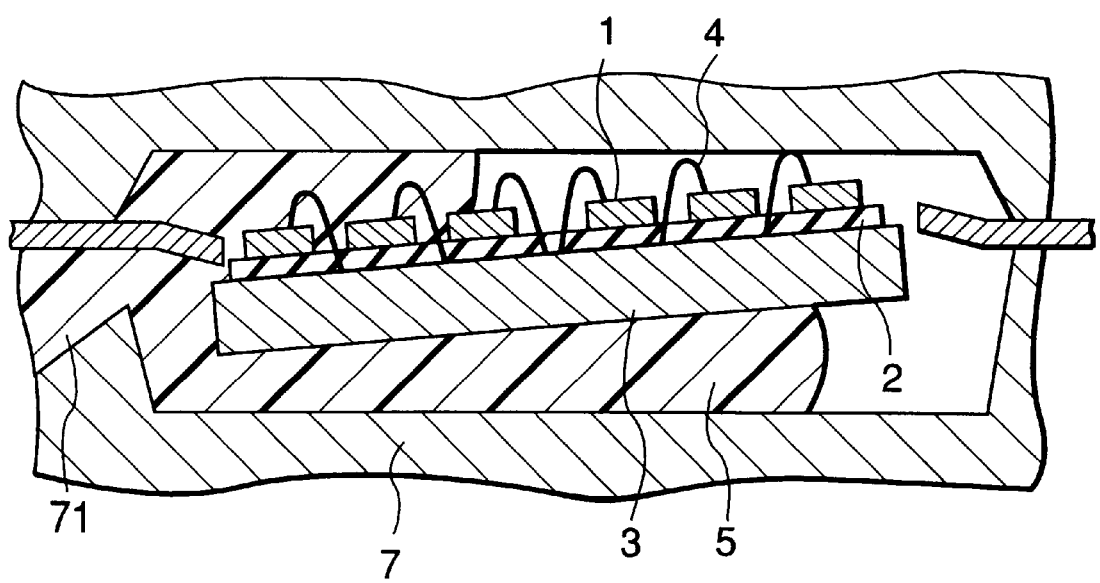
FIG. 1B is a cross-sectional view of the state where a sealing resin is introduced during a fabrication process for the semiconductor apparatus in FIG. 1A.
Figure 2:
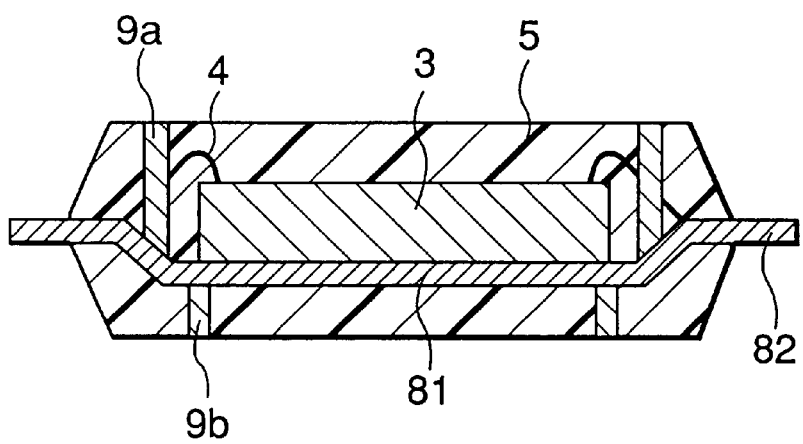
FIG. 2 is a cross-sectional view of another conventional semiconductor apparatus.
Figure 3A:
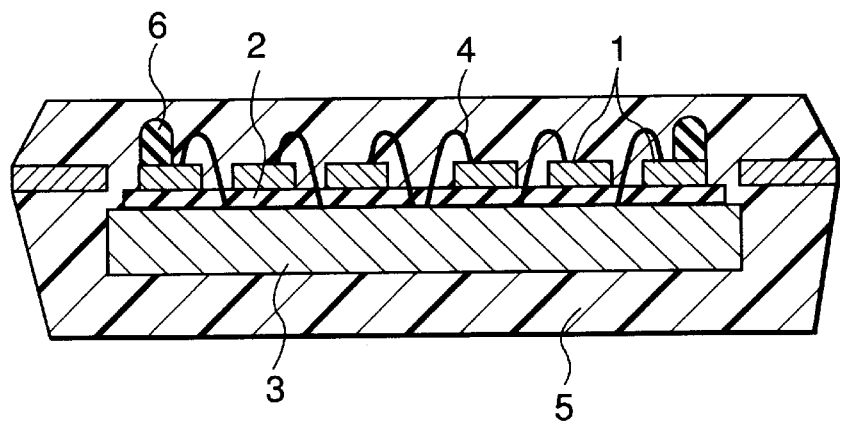
FIG. 3A is a cross sectional view of a semiconductor apparatus according to one embodiment of the present invention.
Figure 3B:
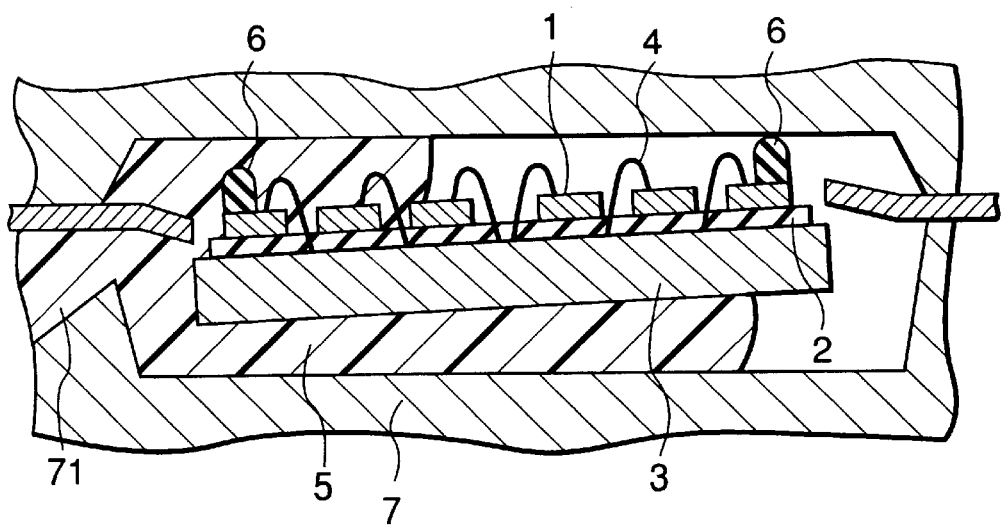
FIG. 3B is a cross-sectional view of the state where a sealing resin is introduced during a fabrication process for the semiconductor apparatus in FIG. 3A.

FIGS. 3A and 3B are cross-sectional views of a semiconductor apparatus according to one embodiment of the present invention, and of the state wherein the sealing resin is introduced into the semiconductor apparatus.

In this embodiments the present invention is applied to one of the conventional semiconductor apparatuses in FIGS.

1A and 1B (hereinafter referred to as prior art 1). As is shown in FIG. 3A, potting resin structures 6 are affixed to the upper surface of a predetermined number (e.g., four) of inner leads 1 of all those that form a lead frame, so that the tops of the potting resin structures 6 are higher than the positions where bonding wires 4 are mounted and lower than the surface of a sealing resin 5 whose location is determined in advance when sealing the semiconductor device 3.

With this arrangement, even when the sealing resin 5 is introduced uniformly into the upper side and the lower side of the semiconductor device 3, as is shown in FIG. 33, the distal ends of the potting resin structures 6 abut upon the internal wall of a sealing jig 7 and serve as stoppers, and the semiconductor device 3 is not shifted further, thus preventing the bonding wires 4 from being exposed at the surface of the sealing resin 5.

In addition, the potting resin structures 6 and the sealing resin 5 are closely attached to each other, and even when a potting resin structure 6 is exposed at the surface of the sealing resin 5, there is no gap between them and moisture can not enter. It is preferable that the same material be used for both the potting resin structures 6 and the sealing resin 5.

In the above embodiment, the semiconductor device 3 is affixed to the lower faces of the inner leads 1 and the potting resin structures 6 are formed only on the upper faces of the inner leads 1, because when the sealing resin 5 is introduced it flows easily into the space under the lower side of the semiconductor device 3, which accordingly tends to be shifted upward. However, if the semiconductor device 3 is to also be shifted downward, all that is necessary is for potting resin structures 6 to be formed on the lower side of the semiconductor device 3, so that the sealing resin 5 of uniform thicknesses can be deposited on the upper and the lower sides of the semiconductor device 3.

As is described above, according to the present invention, before the semiconductor device is sealed by the sealing resin, potting resin structures are affixed to a predetermined number of bonding wire mounting faces of the lead frame that are to be enclosed by the sealing resin, so that the tops of the potting resin structures are higher than the positions at which the bonding wires are mounted. With this arrangement, since the shifting of the semiconductor device is halted by the potting resins during the introduction of the sealing resin, the bonding wires are not exposed at the surface of the sealing resin. And since the potting resin and the sealing resin are closely attached, no gap is formed between them. Therefore, even when the potting resin structures are exposed at the surface of the sealing resin, superior resistance to moisture can be provided, and deterioration of performance and reliability can be prevented.

What is claimed is:

1. A semiconductor apparatus comprising:

a semiconductor device fixed at a predetermined position in a lead frame having a plurality of inner leads, a plurality of electrodes of said semiconductor device connected to corresponding inner leads by bonding wires, said inner leads, said semiconductor device and said bonding wires sealed by a sealing resin; and potting resin structures comprising a rounded upper distal end affixed to a plurality of predetermined faces of said lead frame on which said bonding wires are mounted and sealed by said sealing resin, wherein the tops of said potting resin structures are higher than the positions of said bonding wires and are below an upper surface of said sealing resin.

2. A semiconductor apparatus according to claim 1, wherein an upper height limit and a mounting position for said potting resin structures are so defined that said sealing resin having a predetermined thickness is formed on an upper face and on a lower face of said semiconductor device.

3. A semiconductor apparatus comprising:

a lead frame having a plurality of inner leads;

a semiconductor device fixed to a predetermined portion of said lead frame, a plurality of bonding wires, each of said bonding wires connecting an electrode of said semiconductor device to a corresponding one of said inner leads; and plural potting resin structures affixed to a plurality of said inner leads and sized to extend above an upper height of said bonding wires, wherein said inner leads, said semiconductor device, and said plurality of bonding wires are resin encased in a sealing resin, and wherein said plural potting resin structures further comprise a rounded upper distal end and are below an upper surface of said sealing resin.

4. The apparatus of claim 3, wherein said plural potting resin structures and said sealing resin are comprised of the same material designed and adapted to result in said sealing resin tightly sealing against said plural potting resin structures to inhibit moisture penetration.

5. The apparatus of claim 3, wherein said plural potting resin structures affixed to a plurality of said inner leads are positioned on said inner leads and sized so as to define a minimum thickness of said sealing resin covering said semiconductor device.

* * * * *